United States Patent
Lee (10) Patent No.: US 7,773,709 B2
(45) Date of Patent: Aug. 10, 2010

(54) SEMICONDUCTOR MEMORY DEVICE AND METHOD FOR OPERATING THE SAME

(75) Inventor: Sang-Hee Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 832 days.

(21) Appl. No.: 11/646,418

(22) Filed: Dec. 28, 2006

(65) Prior Publication Data

US 2008/0056028 A1 Mar. 6, 2008

(30) Foreign Application Priority Data

Aug. 31, 2006 (KR) .................. 10-2006-0083559

(51) Int. Cl.
*H04L 7/00* (2006.01)

(52) U.S. Cl. .................. 375/355; 375/360; 375/362; 365/233.16; 365/154; 365/233.13; 365/189.09; 327/299

(58) Field of Classification Search ............ 365/233.16, 365/154, 233.13, 189.09; 327/299; 375/355, 375/360, 362
See application file for complete search history.

(56) References Cited

U.S. PATENT DOCUMENTS

| | | | | |
|---|---|---|---|---|
| 6,950,370 | B2 * | 9/2005 | Lee | ............ 365/233.13 |
| 6,987,705 | B2 * | 1/2006 | Kim et al. | ............ 365/154 |
| 7,457,190 | B2 * | 11/2008 | Lee | ............ 365/233.16 |
| 2009/0121768 | A1 * | 5/2009 | Lee | ............ 327/299 |
| 2009/0168555 | A1 * | 7/2009 | Lee | ............ 365/189.09 |

FOREIGN PATENT DOCUMENTS

| | | |
|---|---|---|
| KR | 1020030089781 | 11/2003 |
| KR | 1020040093892 | 11/2004 |
| KR | 1020040102899 | 12/2004 |
| KR | 1020050011984 | 1/2005 |

OTHER PUBLICATIONS

Korean Office Action, issued in Korean Patent Application No. 9-5-2007-049182513, issued on Sep. 11, 2007.

* cited by examiner

*Primary Examiner*—Sudhanshu C Pathak
(74) *Attorney, Agent, or Firm*—IP & T Law Firm PLC (57) ABSTRACT

A semiconductor memory device includes an aligning signal generator, a data aligning unit, a data transmitting controller and a data transmitter. The aligning signal generator receives a data strobe signal to output aligning signals. The data aligning unit aligns a plurality of data pieces input in succession in response to the aligning signals. The data transmitting controller generates a data transmitting signal synchronized with the transition of the aligning signal. The data transmitter transmits an aligned data output from the data aligning unit to a data storage area in response to the data transmitting signal. A method for driving the semiconductor memory device includes aligning data pieces input in succession as parallel data in response to a data strobe signal, generating a data transmitting signal corresponding to transition of the data strobe signal and transmitting the parallel data to a data storage area in response to the data transmitting signal.

24 Claims, 7 Drawing Sheets

SEMICONDUCTOR MEMORY DEVICE AND METHOD FOR OPERATING THE SAME

CROSS-REFERENCE TO RELATED APPLICATIONS

The present invention claims priority of Korean patent application number 10-2006-0083559, filed in the Korean Patent Office on Aug. 31, 2006, which is incorporated by reference in its entirety.

BACKGROUND OF THE INVENTION

The present invention relates to a semiconductor memory device; more particularly, to a data input circuit for use in the semiconductor memory device and a method for controlling an operation thereof.

The semiconductor memory device stores data and outputs the data stored. The semiconductor memory device comprises a data storage area and an I/O peripheral area. In the data storage area, there are a plurality of unit cells for storing data, and in the I/O peripheral area, there is a data I/O circuit for outputting data stored in the data storage area or transmitting external data into the data storage area.

The I/O area includes a data input circuit, a data output circuit, an address input circuit and a command input circuit. The data input circuit delivers external data into the data storage area in response to a write command. The data output circuit outputs data, stored in the data storage area, to an external device in response to a read command. The address input circuit decodes an input address representing the location of the data corresponding to input and output operations. The command input circuit receives the read and write commands and controls other circuits.

Semiconductor memory devices are required to input/output data at increasingly higher speed. As technology has advanced, an operating speed of a system including a semiconductor memory device has increased. At first, a synchronous semiconductor memory device was designed for transmitting data at high speed. The synchronous semiconductor memory device would input data synchronized with a clock signal. However, as an operating speed of a system including the semiconductor memory device has continued to increase, a DDR synchronous semiconductor memory device, which inputs or outputs data on both of the rising and falling edges of a clock signal, has been designed.

There are challenges for semiconductor memory device that inputs data on both of the rising and falling edges of a clock signal. Because a delay time is introduced when the clock signal and the data are transmitted to the semiconductor memory device, the semiconductor memory device may not receive the data accurately synchronized with transitions of the clock signal if the system operates at a very high speed.

Due to delay times introduced when the clock signal and the data are transmitted, the existing margin for transmitting one piece data into the semiconductor memory device on every half period of the clock signal is insufficient. Accordingly, a DDR synchronous semiconductor memory device does not input data corresponding to the transition of the clock signal but a data strobe signal. Herein, the data strobe signal is transited with the input timing of the data. A semiconductor device transmitting the data generates the data strobe signal when it outputs data, and inputs the data strobe signal into the semiconductor memory device. The semiconductor memory device inputs the data corresponding to transitions of the data strobe signal. However, the semiconductor memory device uses the clock signal for internal operations based on read and write commands.

Meanwhile, the semiconductor memory device performs a prefetch operation to input a plurality of pieces of data at high speed. The prefetch operation is for aligning a plurality of data input in succession to convert it to parallel data. Because the parallel data are processed simultaneously in the data storage area, a plurality of data pieces can be processed at high speed. In order to increase operating speed, the semiconductor memory device requires a circuit which receives a plurality of data input in succession and aligns the data. If the size of the pieces of data which are input to one data input circuit in one write operation is 4 bits, it means performing 4 bit prefetch operations.

The data input circuit inputs data in response to the transition of the data strobe signal. Pieces of data input in succession are aligned and converted into parallel data. The data input circuit transmits the parallel data to the data storage area, according to a signal synchronized with the clock signal.

Figure 1:
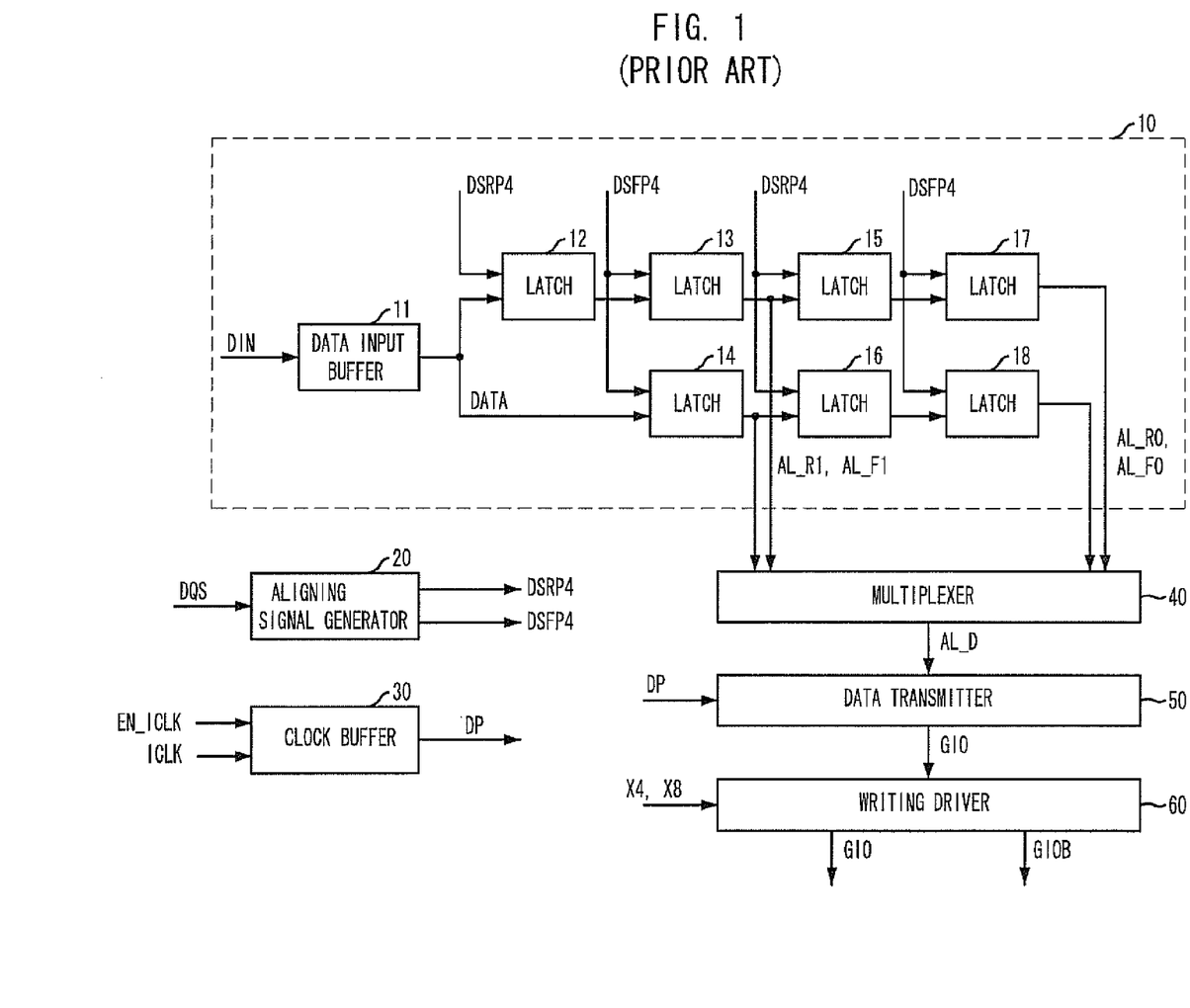
FIG. 1 is a block diagram of a conventional semiconductor memory device.

FIG. 1 illustrates a block diagram of a conventional semiconductor memory device. In particular, the data input circuit of the semiconductor memory device is described. The data input circuit includes a data aligning unit 10, an aligning signal generator 20, a clock buffer 30, multiplexer 40, a data transmitter 50 and an writing driver 60.

The data aligning unit 10 includes a data input buffer 11 and a plurality of latches 12 to 18. The data input buffer 11 receives and buffers external data DIN, and outputs to latches 12 and 14. The plurality of latches 12 to 18 latches data, input from the input buffer 11 in order of precedence, in response to the aligning signals DSRP4 and DSFP4. The plurality of latches 12 to 18 aligns and outputs 4 pieces of data AL_R0, AL_F0, AL_R1 and AL_F1 in parallel to the multiplexer 40.

The aligning signal generator 20 generates and outputs the aligning signals DSRP4 and DSFP4, respectively synchronized with rising and falling edges of the data strobe signal DQS. The clock buffer 30 generates a data transmitting signal DP, synchronized with the transition of an internal clock signal ICLK, in response to a clock enabling signal EN_ICLK.

The multiplexer 40 outputs a data signal AL_D to the data transmitter 50. The multiplexer is used when the semiconductor memory device operates in every mode, such as X4, X8 and X16 modes. Because all of the data input circuits receive data in the X16 mode, the multiplexer does not need to operate. However, only 4 or 8 number of data input circuits operate in the X4 or X8 modes respectively. Because each data transmitting line corresponds to each data input circuit, the data can be transmitted to the corresponding data transmitting line by the multiplexer 40.

The data transmitter 50 receives and amplifies the data signal AL_D, output from the multiplexer 40, in response to the data transmitting signal DP. The data transmitter 50 outputs a data signal GIO to the writing driver 60. The writing driver 60 transmits a data signal pair GIO and GIOB to the data storage area.

The parallel data AL_R0, AL_F0, AL_R1 and AL_F1, output from the data aligning unit 10, are synchronized with the data strobe signal. However, the data transmitter 50 transmits the data signal, synchronized with the data transmitting signal DP. Thus, a basis signal for the data transmission is changed from the data strobe signal into the clock signal. Herein, the change of the basis signal for the data transmission is referred to as a domain crossing.

Figure 2:
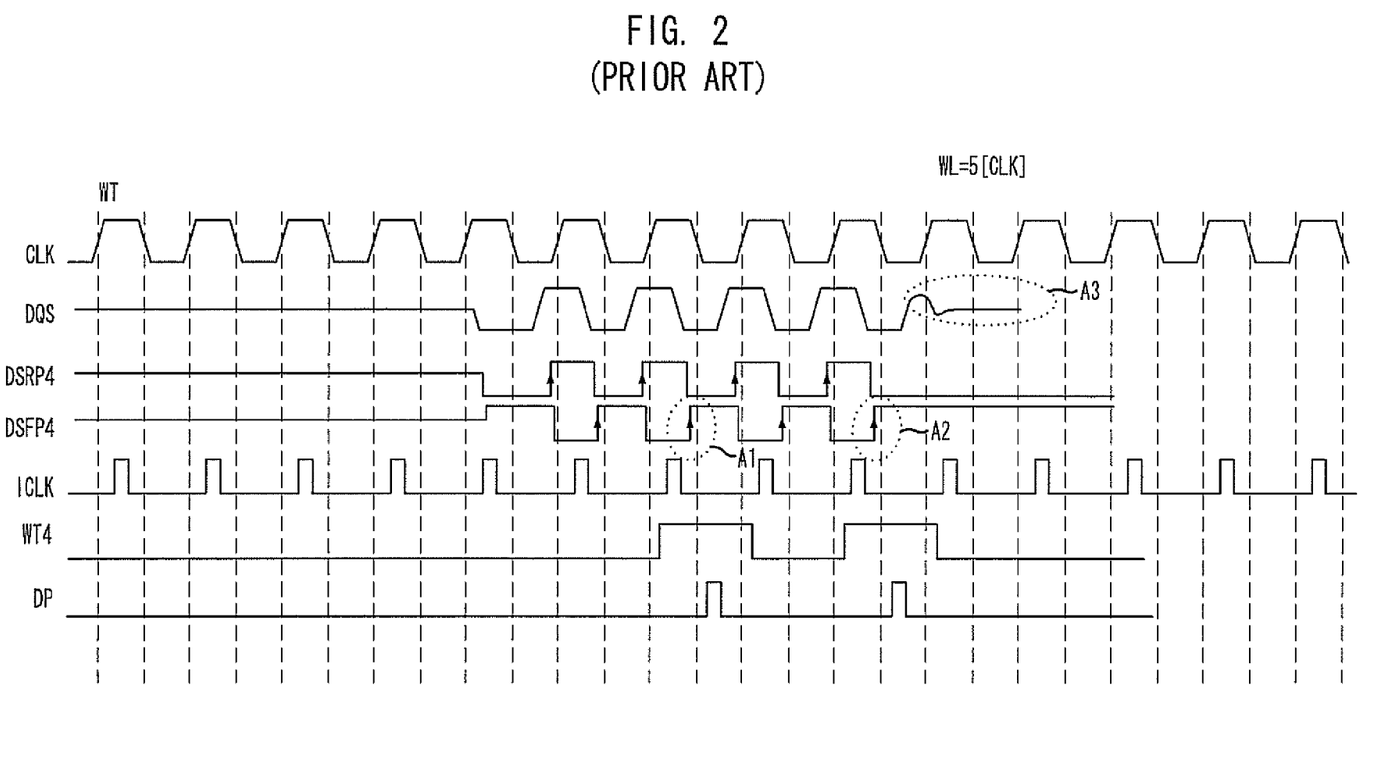
FIG. 2 is a signal timing diagram of the semiconductor memory device described in FIG. 1.

FIG. 2 illustrates a signal timing diagram of the semiconductor memory device described in FIG. 1. The data strobe signal DQS is transitioned corresponding to a data input timing and input to the semiconductor memory device. The operating margin of the data strobe signal DQS is a half cycle of the clock. This means that the difference between the input timings of the earliest and latest strobe signals DQS is a half cycle of the clock. Because the operating margin of the data strobe signal DQS is half of the clock, the operating margin for the data aligning unit 10 to align the data is a quarter cycle of the clock.

Thereafter, the aligning signals DSRP4 and DSFP4 are generated, respectively corresponding to rising and falling transitions of the data strobe signal DQS. Pieces of data are aligned in response to the aligning signals DSRP4 and DSFP4. At points A1 and A2 described in FIG. 2, 4 pieces of data are aligned. The data transmitting signal DP is generated by performing a logic operation based on the clock enabling signal EN_ICLK and the internal clock signal ICLK, which is buffered from the clock signal. The aligned data are transmitted to the next stage in response to the data transmitting signal DP.

As technology develops, a clock signal of a system including the semiconductor memory device has increasingly higher frequency. An input speed of data to the semiconductor memory device is consequently increased. Accordingly, an operating margin of the data input circuit is decreased. An operating margin for a domain crossing, i.e., a time margin for aligning the data based on the aligning signals and transmitting the data in response to the data transmitting signal DP, is also decreased.

According to conditions of a manufacturing process or the level of temperatures and supply voltages during operation, operation performance characteristics of the semiconductor memory device will change. At a high clock signal frequency, even if the operation performance only changes a little, the data input circuit of the semiconductor memory device may nevertheless operate in excess of its operating margin. It is possible that the data input circuit will operate abnormally because the data input circuit can not perform required operations within the necessary amount of time. In particular, within the necessary amount of time, the margin that the clock buffer generates and transmits the data transmitting signal may be absolutely insufficient.

In addition, a ring back of a clock signal can be caused at high frequencies, which results in malfunctioning of the data input circuit. This is illustrated at point A3 in FIG. 2. The ring back represents that the transition of the data strobe signal is dominated by noise. If the transition of the data strobe signal occurs without any data input, defective data can be transmitted to the data storage area through the data input circuit. As the input margin of the data transmitting signal, which is input to the data transmitter, is decreased, ring back has more influence on operation. Thus, normal data may be substituted with faulty data.

SUMMARY OF THE INVENTION

Embodiments of the present invention are directed to provide a semiconductor memory device having an improved operating margin when receiving a plurality of pieces of data in succession and storing the plurality of pieces of data.

In accordance with an aspect of the present invention, the semiconductor memory device comprises an aligning signal generator for receiving a data strobe signal to output aligning signals, a data aligning unit for aligning a plurality of pieces of data input in succession according to the aligning signals, a data transmitting controller for generating a data transmitting signal synchronized with the transition of the aligning signals, and a data transmitter for transmitting an aligned data, output from the data aligning unit, to a data storage area in response to the data transmitting signal.

In accordance with another aspect of the present invention, the semiconductor memory device comprises an aligning signal generator for receiving a data strobe signal to output aligning signals, a data aligning unit for aligning a plurality of input data pieces according to the aligning signals, a writing signal generator to output writing delay signals by delaying a writing signal which corresponds to a writing latency, in response to the transition timing of a clock signal, a data transmitting signal generator for generating a data transmitting signal by restricting the period of the aligning signal within the period of an activation of the writing delay signals, and a data transmitter for transmitting an aligned data output from the data aligning unit to a data storage area in response to the data transmitting signal.

In accordance with a further aspect of the present invention, a method for driving a semiconductor memory device includes aligning data pieces input in succession into parallel data in response to a data strobe signal, generating a data transmitting signal corresponding to transitioning of the data strobe signal and transmitting the parallel data to a data storage area in response to the data transmitting signal.

DESCRIPTION OF SPECIFIC EMBODIMENTS

Hereinafter, a semiconductor memory device in accordance with the present invention will be described in detail referring to the accompanying drawings.

Figure 3:
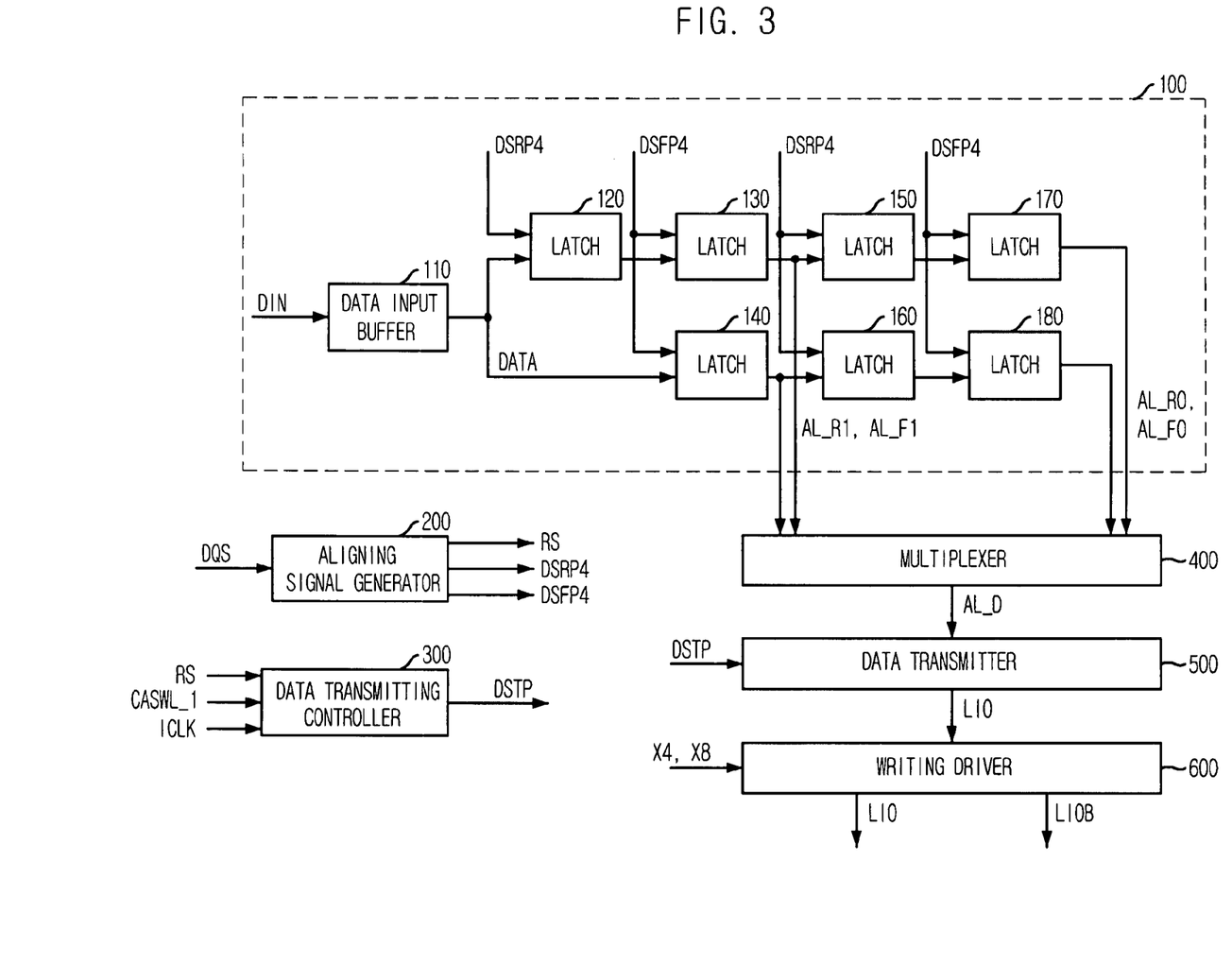
FIG. 3 is a block diagram of a semiconductor memory device in accordance with the present invention.

FIG. 3 illustrates a block diagram of a semiconductor memory device in accordance with an embodiment of the present invention. The semiconductor memory device includes a data aligning unit 100, an aligning signal generator 200, a data transmitting controller 300, a multiplexer 400, a data transmitter 500 and a writing driver 600.

The data aligning unit 100 aligns a plurality of data pieces DIN input in succession and outputs aligned data AL_R0, AL_R1, AL_F0 and AL_F1, in response to the aligning signals DSRP4 and DSFP4. The data aligning unit 100 includes a data input buffer 110 and a plurality of latches 120 to 180. The data input buffer 110 receives and buffers external data DIN to thereby output buffered data to latches 120 and 140. The plurality of latches 120 to 180 latch data, input from the data input buffer 110 in order of precedence, in response to the aligning signals DSRP4 and DSFP4. The plurality of latches 120 to 180 aligns and outputs pieces of data AL_R0, AL_F0, AL_R1 and AL_F1 in parallel to the multiplexer 400.

The aligning signal generator 200 generates the aligning signals DSRP4 and DSFP4, respectively synchronized with rising and falling edges of a data strobe signal DQS. The aligning signal generator 200 also generates a reference signal RS buffered from the data strobe signal DQS. For processing a plurality of data pieces, the first aligning signal DSRP4 is used to align data on odd turns and the second aligning signal DSFP4 is used to align data on even turns.

The data transmitting controller 300 receives the reference signal RS, a writing signal CASWL_1 corresponding to writing latency, and a clock signal ICLK. The data transmitting controller 300 generates a data transmitting signal DSTP, synchronized with the transition of the aligning signals DSRP4 and DAFP4. The clock signal ICLK is generated based on an external clock signal CLK. The writing signal CASWL_1 is activated faster than the writing latency by one clock and maintains its activation for one clock period.

The multiplexer 40 transmits the aligned data AL_R0, AL_R1, AL_F0 and AL_F1 output from the data aligning unit 100 to the data transmitter 500. The data transmitter 500 transmits the data signal AL_D, output from the multiplexer 400 to the writing driver 600, in response to the data transmitting signal DSTP. The writing driver 600 transmits a data signal pair LIO and LIOB to the data storage area, based on a data signal LIB output from the data transmitter 500.

Figure 4:
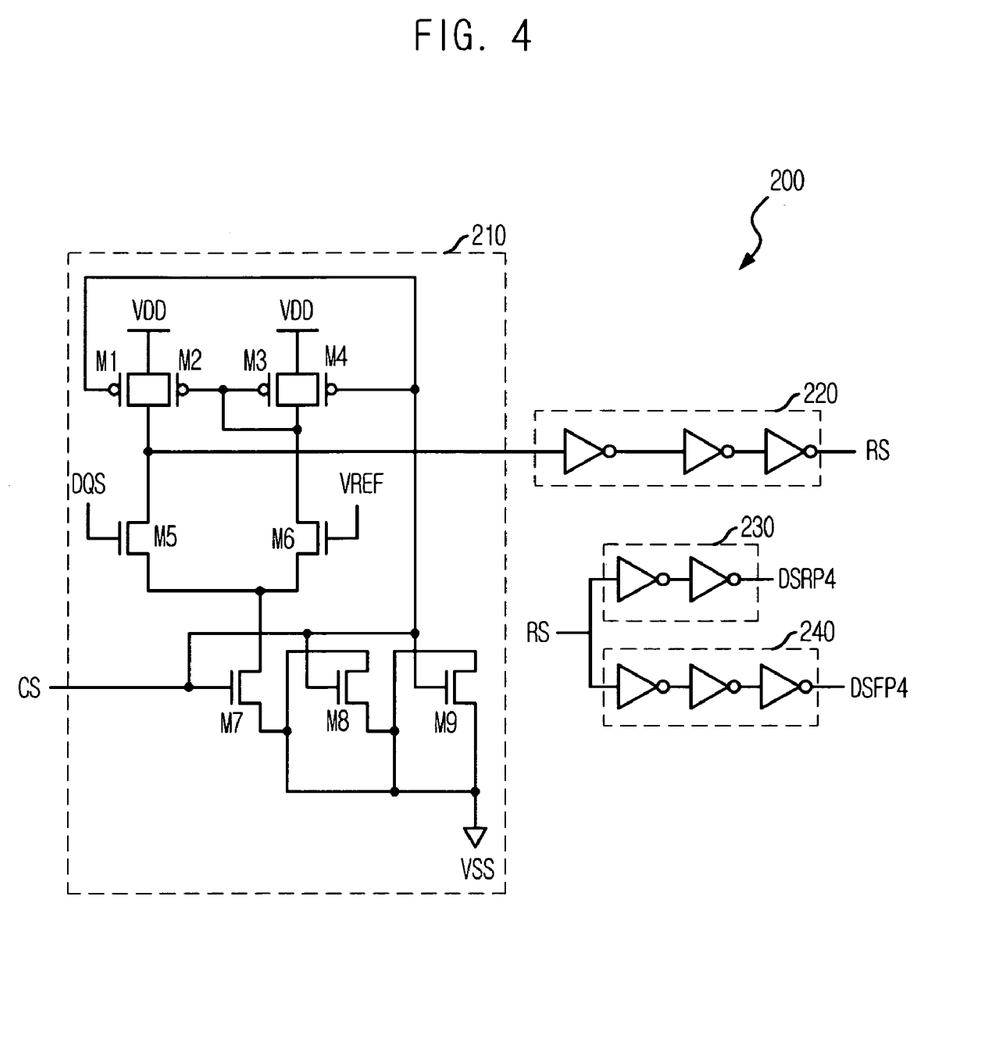
FIG. 4 is a schematic circuit diagram of an aligning signal generator described in FIG. 3.

FIG. 4 illustrates a schematic circuit diagram of the aligning signal generator described in FIG. 3. The aligning signal generator is enabled by a control signal CS. The aligning signal generator 200 includes a sensing unit 210, a first signal generator 220, a second signal generator 230 and a third signal generator 240.

The sensing unit 210 receives the data strobe signal DQS and senses rising and falling transitions of the data strobe signal DQS. The first signal generator 220 outputs the reference signal RS, which is transitioned in response to the rising and the falling transitions of the data strobe signal DQS. The second signal generator 230 buffers an output of the first signal generator 220 to output the aligning signal DSRP4. The third signal generator 240 inverts the output of the first signal generator 220 to output the aligning signal DSFP4.

Figure 5:
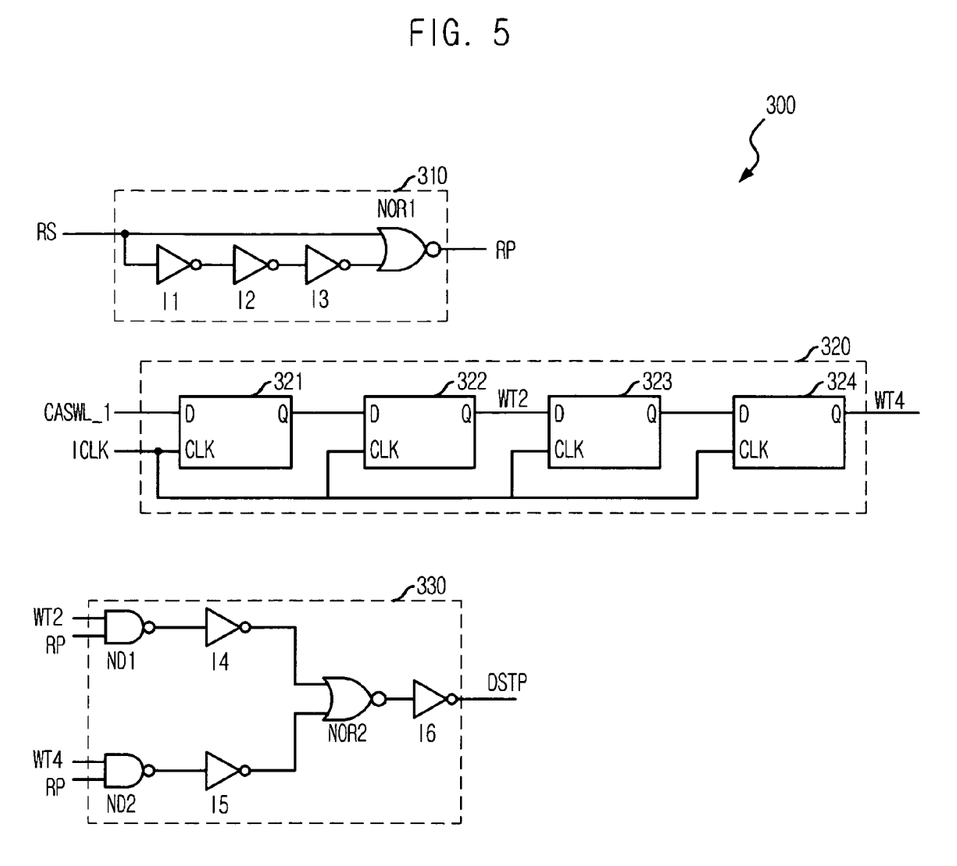
FIG. 5 is a schematic circuit diagram of a data transmitting controller described in FIG. 3.

FIG. 5 illustrates a schematic circuit diagram of a data transmitting controller described in FIG. 3. The data transmitting controller 300 includes a pulse generator 310, a writing signal delay unit 320 and a signal comparator 330.

The pulse generator 310 includes a plurality of inverters I1 to I3 and a NOR gate NOR1, in order to invert the reference signal RS and output a reference pulse RP.

The writing signal delay unit 320 delays the writing signal CASWL_1, corresponding to the number of the data pieces aligned by the data aligning unit 100, at a transition timing of the clock signal ICLK. The writing signal delay unit 320 generates writing delay signals WT2 and WT4. The writing signal delay unit 320 includes four D-flip flops 321 to 324, which each receive the clock signal ICLK through a clock input terminal CLK. The first D-flip flop 321 receives the writing signal CASWL_1 through a data input terminal D. Each of the other three D-flip flops 322 to 324 receives an output of the former D-flip flop through a data input terminal D. The second and the fourth D-flip flops 322 and 324 respectively output the writing delay signals WT2 and WT4.

The signal comparator 330 generates the data transmitting signal DSTP by restricting the period of the reference pulse RP within activation of the writing delay signals WT2 and WT4. The signal comparator 330 includes two NAND gates ND1 and ND2, three inverters I4 to I6 and a NOR gate NOR2. The first NAND gate ND1 performs a logic NAND operation upon the writing delay signal WT2 and the reference pulse RP. The second NAND gate ND2 performs a logic NAND operation upon the writing delay signal WT4 and the reference pulse RP. The inverters I4 and I5 invert outputs of NAND gates ND1 and ND2 respectively. The NOR gate NOR2 performs a logic NOR operation to outputs of the inverters I4 and I5. The inverter I6 inverts an output of the NOR gate NOR2 and outputs the data transmitting signal DSTP.

Figure 6:
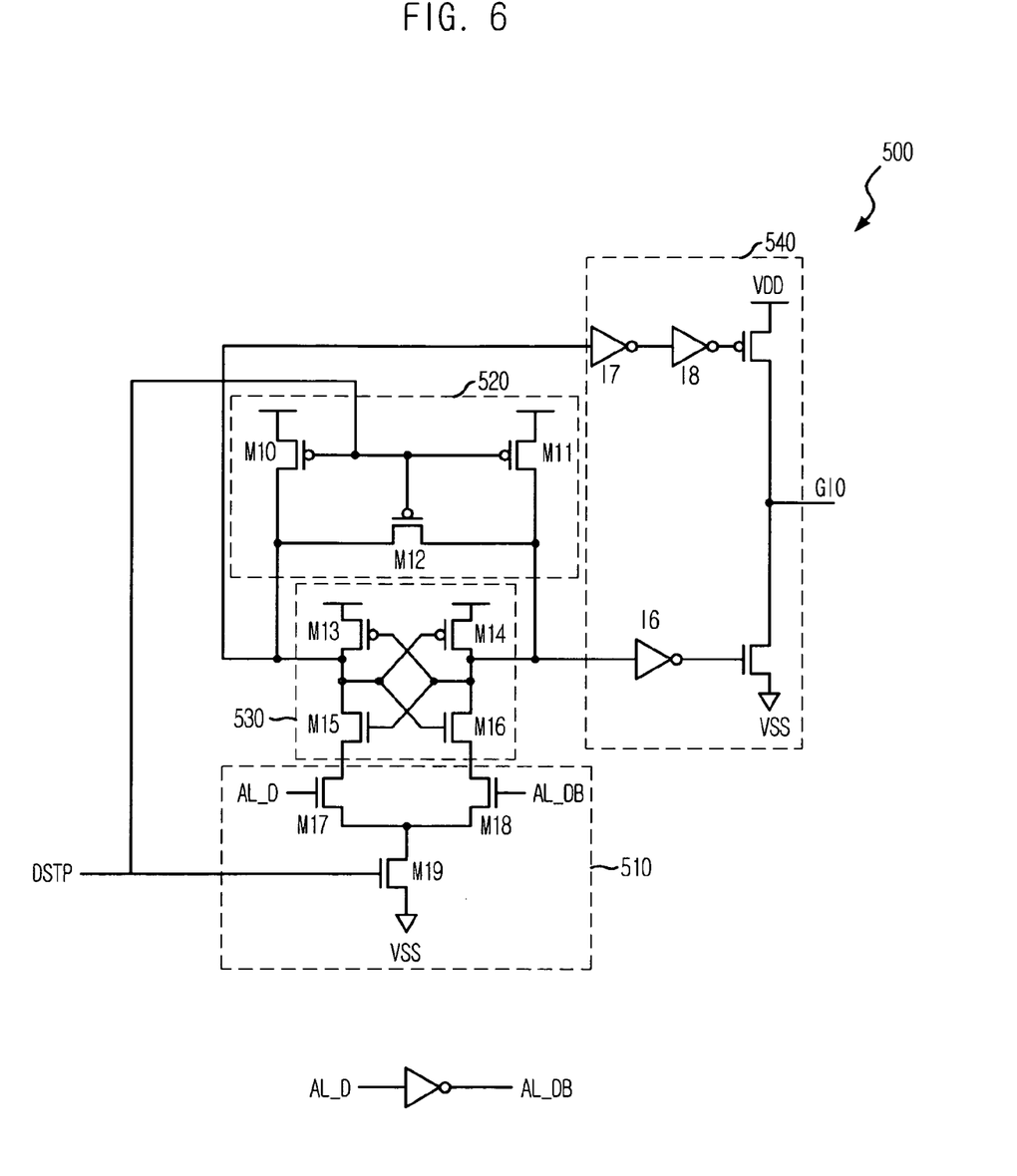
FIG. 6 is a schematic circuit diagram of a data transmitter described in FIG. 3.

FIG. 6 illustrates a schematic circuit diagram of the data transmitter described 500 in FIG. 3. The data transmitter 500 includes a data input unit 510, a precharge unit 520, a latch unit 530 and an output unit 540.

The data input unit 510, activated in response to the data transmitting signal DSTP, receives the data signal AL_D and an invert data signal AL_DB. The latch unit 530 senses and amplifies the data signal AL_D and the invert data signal AL_DB. The latch unit 530 latches the amplified data signals. The precharge unit 520, enabled in response to the data transmitting signal DSTP, resets an output terminal of the latch unit 530. The output unit 540 outputs latched data signals from the latch unit 530 to the writing driver 600.

Figure 7:
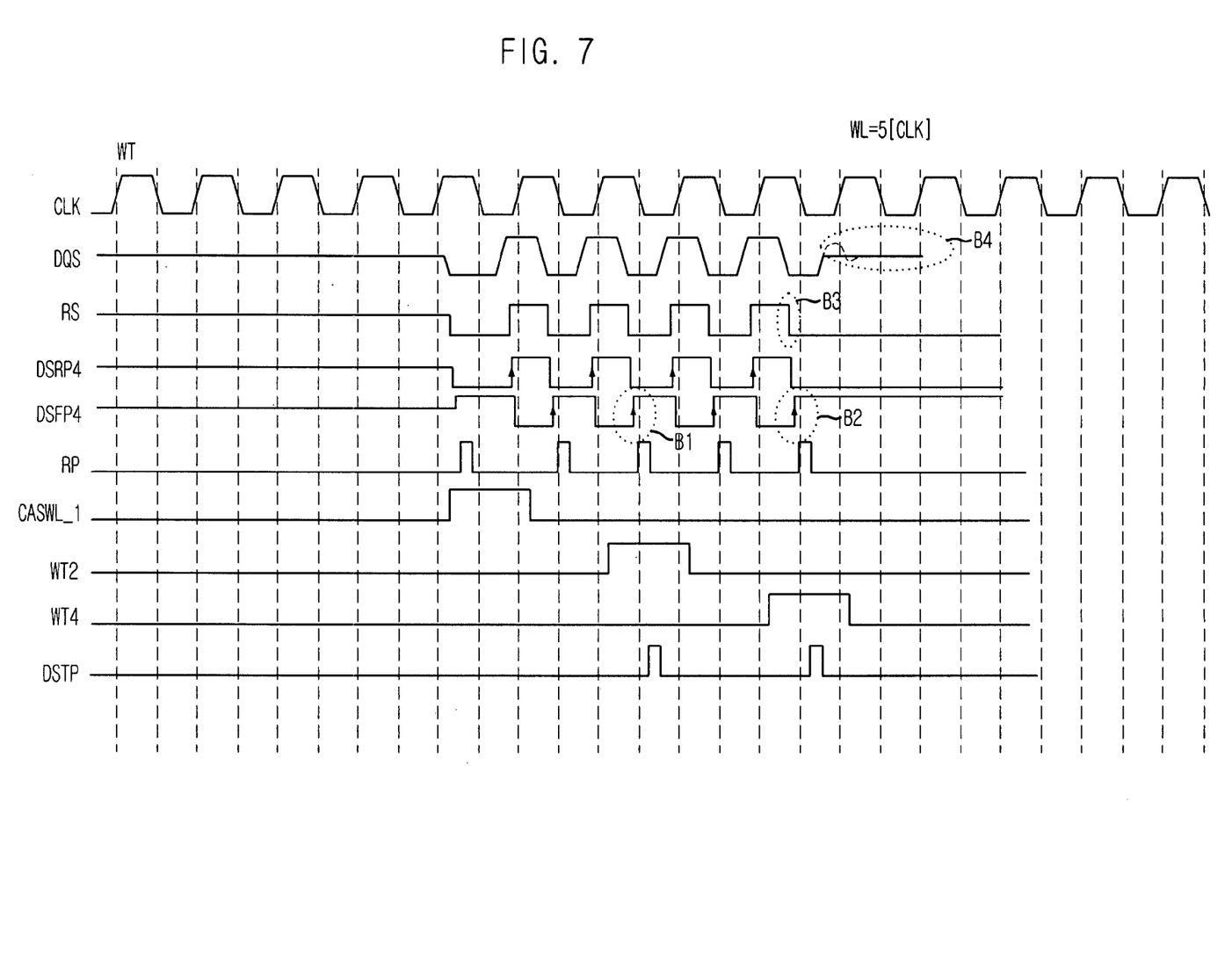
FIG. 7 is a signal timing diagram of the semiconductor memory device described in FIG. 3.

FIG. 7 illustrates a signal timing diagram of the semiconductor memory device described in FIG. 3. The aligning signal generator 200 generates the reference signal RS in response to the transition of the data strobe signal DQS. The aligning signal generator 200 generates the aligning signal DSRP4 by buffering the reference signal RS and the aligning signal DSFP4 by inverting the reference signal RS. The data aligning unit 100 aligns the plurality of data pieces DIN input in succession as the data AL_R0, AL_R1, AL_F0 and AL_F1, in response to the aligning signals DSRP4 and DSFP4. Aligning 4 bit of data is completed at each timing point B1 and B2 depicted in FIG. 7.

Meanwhile, the pulse generator 310 in the data transmitting controller 300 generates the reference pulse RP with the reference signal RS. The writing signal delay unit 320 delays the writing signal CASWL_1 corresponding to the number of data pieces to be aligned by the data aligning unit 100. The writing signal delay unit 320 generates writing delay signals WT2 and WT4, delayed in response to transition of the clock signal ICLK. Supposing that 4 pieces of data are input two times in succession as depicted in FIG. 7, the writing delay signals WT2 and WT4 are delayed from the writing signal CASWL_1 by 2 and 4 periods of the clock signal ICLK respectively. Because the 4 pieces of data are input on the rising and falling edges of the clock signal ICLK, the 4 pieces of data can be entirely input in 2 periods of the clock signal ICLK. The signal comparator 330 generates the data transmitting signal DSTP by performing a logic operation to the writing delay signals WT2 and WT4 and the reference pulse RP. The data transmitter 500 transmits the aligned data signal LIO, output from the multiplexer 400 to the writing driver 600, in response to the data transmitting signal DSTP. The writing driver 600 transmits the data signals LIO and LIOB to the data storage area.

Accordingly, in accordance with the present invention, the aligning signals DSRP4 and DSFP4 synchronized with the data strobe signal DQS are used to align the data in the data input circuit. Moreover the data transmitting signal DSTP, used to transmit the aligned data to the data storage area, is generated with the data strobe signal DQS. In particular, the data transmitting signal DSTP is generated in response to a falling edge of the data strobe signal DQS.

The data transmitting signal DSTP is generated closely after the data are aligned. It takes less time to input the data aligned and transmitted to the data storage area into the data input circuit, as compared with the conventional device. Because the operation time of the data input circuit is reduced, the data input circuit can receive data input at higher speeds and still successfully transmit to the data storage area. Signals for aligning the data and transmitting the aligned data are generated from the data strobe signal. The operating margin between the data strobe signal and the clock signal no longer presents a problem.

The semiconductor memory device in accordance with the present invention prevents ring back. Even if the data strobe signal transitions after data input is completed, the data input circuit has already completed transmission of the data. Faulty data cannot be transmitted to the data storage area through the data input circuit under the conditions illustrated at point B4 in FIG. 7.

In accordance with the present invention, the operation margin for aligning and transmitting the plurality of data is dramatically improved. Accordingly, there can be provided a semiconductor memory device operating at high speed. The operational reliability of the semiconductor memory device is also improved.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   an aligning signal generator for receiving a data strobe signal to output aligning signals;
   a data aligning unit for aligning a plurality of data pieces input in succession according to the aligning signals;
   a data transmitting controller for generating a data transmitting signal synchronized with the transition of the aligning signals; and
   a data transmitter for transmitting an aligned data, output from the data aligning unit, to a data storage area in response to the data transmitting signal.

2. The semiconductor memory device of claim 1, wherein the aligning signal generator outputs first and second aligning signals, each respectively synchronized with first and second transitions of the data strobe signal.

3. The semiconductor memory device of claim 2, wherein the data aligning unit alternately aligns the input data in response to the first and second aligning signals.

4. The semiconductor memory device of claim 3, wherein the aligning signal generator includes:
   a sensing unit for receiving the data strobe signal and sensing the first and the second transitions of the data strobe signal;
   a first signal generator for outputting a reference signal transitioned in response to the transitions of the data strobe signal;
   a second signal generator for buffering an output of the first signal generator and outputting the first aligning signal; and
   a third signal generator for inverting the output of the first signal generator and outputting the second aligning signal.

5. The semiconductor memory device of claim 4, wherein the data transmitting controller includes:
   a pulse generator for generating a reference pulse is response to the reference signal;
   a writing signal delay unit for delaying a writing signal in response to a transition timing of a clock signal, where the length of the delay corresponds to the number of the data pieces to be aligned by the data aligning unit, and outputting a first and a second writing delay signals; and
   a signal comparator for generating the data transmitting signal by restricting the period of the reference pulse to periods of activation of the writing delay signals,
   wherein the writing signal is activated corresponding to writing latency.

6. The semiconductor memory device of claim 5, wherein the pulse generator includes:
   a plurality of inverters for inverting the reference signal; and
   a NOR gate for receiving an output of the plurality of inverters and the reference signal and outputting the reference pulse.

7. The semiconductor memory device of claim 5, wherein the writing signal delay unit includes:
   a first D-flip flop for receiving the clock signal through a clock input terminal and the writing signal through a data input terminal;
   a second D-flip flop for receiving the clock signal through a clock input terminal and an output of the first D-flip flop through a data input terminal;
   a third D-flip flop for receiving the clock signal through a clock input terminal and an output of the second D-flip flop through a data input terminal; and
   a fourth D-flip flop for receiving the clock signal through a clock input terminal and an output of the third D-flip flop through a data input terminal,
   wherein outputs of second and the fourth D-flip flops are the first and second writing delay signals respectively.

8. The semiconductor memory device of claim 7, wherein the signal comparator includes:
   a first logical product unit for performing a logic operation upon the first writing delay signal and the reference pulse;
   a second logical product unit for performing a logic operation upon the second writing delay signal and the reference pulse; and
   a logical sum unit for performing a logic operation to outputs of the first and the second logical product units and outputting the data transmitting signal.

9. The semiconductor memory device of claim 1, wherein the data transmitter includes:
   a data input unit, activated in response to the data transmitting signal, for receiving the aligned data;
   a latch unit for latching the aligned data; and
   an output unit for outputting latched data from the latch unit to the data storage area.

10. The semiconductor memory device of claim 1, further including a multiplexer for transmitting the aligned data to the data transmitter.

11. The semiconductor memory device of claim 1, further including a writing driver for driving data transmitting lines in order to transmit the output of the data transmitter to the data storage area.

12. The semiconductor memory device of claim 1, wherein the data transmitting signal is synchronized with a falling edge of the aligning signal.

13. A semiconductor memory device, comprising: an aligning signal generator for receiving a data strobe signal to output aligning signals; a data aligning unit for aligning a plurality of input data pieces according to the aligning signals; a writing signal generator for outputting writing delay signals by delaying a writing signal, which corresponds to a writing latency, in response to a transition timing of a clock signal; a data transmitting signal generator for generating a data transmitting signal by restricting the period of the aligning signals to periods of activation of the writing delay signals; and a data transmitter for transmitting an aligned data output from the data aligning unit to a data storage area in response to the data transmitting signal.

14. The semiconductor memory device of claim 13, wherein the aligning signal generator outputs first and second aligning signals, each respectively synchronized with first and second transitions of the data strobe signal.

15. The semiconductor memory device of claim 14, wherein the data aligning unit alternately aligns the input data in response to the first and second aligning signals.

16. The semiconductor memory device of claim 15, wherein the aligning signal generator includes:
    a sensing unit for receiving the data strobe signal and sensing the first and the second transitions of the data strobe signal;
    a first signal generator for outputting a reference signal transitioned in response to the transitions of the data strobe signal;
    a second signal generator for buffering an output of the first signal generator and outputting the first aligning signal; and
    a third signal generator for inverting the output of the first signal generator and outputting the second aligning signal.

17. The semiconductor memory device of claim 16, wherein the data transmitter includes:
    a data input unit, activated in response to the data transmitting signal, for receiving the aligned data;
    a latch unit for latching the aligned data; and
    an output unit for outputting latched data from the latch unit to the data storage area.

18. The semiconductor memory device of claim 13, further including a multiplexer for transmitting the aligned data to the data transmitter.

19. The semiconductor memory device of claim 18, further including a writing driver for driving data transmitting lines in order to transmit the output of the data transmitter to the data storage area.

20. The semiconductor memory device of claim 13, wherein the data transmitting signal is synchronized with a falling edge of the data strobe signal.

21. A method for driving a semiconductor memory device, comprising:
    aligning pieces of data input in succession as parallel data in response to a data strobe signal;
    generating a data transmitting signal corresponding to transiting of the data strobe signal; and
    transmitting the parallel data to a data storage area in response to the data transmitting signal.

22. The method of claim 21, wherein the aligning the data includes:
    generating a first aligning signal in response to a first transition of the data strobe signal;
    generating a second aligning signal in response to a second transition of the data strobe signal;
    aligning data in odd turns, among the pieces of data input in succession, in response to the first aligning signal; and
    aligning data in even turns, among the pieces of data input in succession, in response to the second aligning signal.

23. The method of claim 21, wherein the generating the data transmitting signal includes:
    generating a reference pulse in response to transition of the data strobe signal;
    generating a writing signal corresponding to writing latency;
    generating writing delay signals by delaying the writing signal in response to a transition timing of a clock signal, where the length of the delay corresponds to the number of the pieces of data input in succession; and
    generating the data transmitting signal by restricting the period of the reference pulse to periods of activation of the writing delay signals.

24. The method of claim 21, wherein the data transmitting signal is synchronized with a falling edge of the data strobe signal.

* * * * *